United States Patent [19]

Mizuhara et al.

[11] Patent Number: 5,368,220
[45] Date of Patent: Nov. 29, 1994

[54] SEALED CONDUCTIVE ACTIVE ALLOY FEEDTHROUGHS

[75] Inventors: Howard Mizuhara, Hillsborough; P. C. Smith, Burlingame, both of Calif.

[73] Assignee: Morgan Crucible Company plc, Windsor, England

[21] Appl. No.: 925,086

[22] Filed: Aug. 4, 1992

[51] Int. Cl.$^5$ ............... H01B 17/26; B23K 35/30; B23K 101/38
[52] U.S. Cl. ............... 228/124.5; 174/50.61; 174/263; 174/265
[58] Field of Search ............... 228/122, 263.12; 174/50.61, 50.56, 263, 265, 267

[56] References Cited

U.S. PATENT DOCUMENTS

| | | |
|---|---|---|
| 2,121,590 | 6/1938 | Espe . |
| 3,436,109 | 4/1969 | Loose . |
| 3,517,437 | 6/1970 | Szobanya . |
| 3,746,896 | 7/1973 | Gruner . |
| 3,858,097 | 12/1974 | Polye . |
| 3,901,772 | 8/1975 | Guillotin et al. . |
| 3,929,426 | 12/1975 | Blust et al. ............... 228/122 X |
| 4,345,299 | 8/1982 | Ho . |
| 4,371,588 | 2/1983 | Kyle . |
| 4,507,975 | 4/1985 | Bittner et al. . |
| 4,623,513 | 11/1986 | Mizuhara . |
| 4,716,649 | 1/1988 | Bittner et al. . |
| 4,723,863 | 2/1988 | Takagi et al. . |
| 4,735,866 | 4/1988 | Moorhead . |
| 4,835,344 | 5/1989 | Iyogi et al. ............... 228/124.5 |
| 4,883,745 | 11/1989 | Mizuhara ............... 228/263.18 |
| 4,912,838 | 4/1990 | Goto et al. ............... 29/854 X |
| 5,095,759 | 3/1992 | Mizuhara et al. ............... 420/507 |
| 5,129,572 | 7/1992 | Keilberth ............... 228/156 |
| 5,194,697 | 3/1993 | Hegner et al. ............... 174/50.56 |
| 5,241,216 | 8/1993 | Webster ............... 228/122.1 |

FOREIGN PATENT DOCUMENTS

| | | |
|---|---|---|
| 0055811 | 7/1982 | European Pat. Off. . |
| 0113928 | 7/1984 | European Pat. Off. . |
| 0080535 | 8/1985 | European Pat. Off. . |
| 0278741 | 8/1988 | European Pat. Off. . |
| 0351701 | 1/1990 | European Pat. Off. . |
| 1098727 | 8/1961 | Germany . |
| 2806761 | 9/1978 | Germany . |
| 2950039 | 7/1981 | Germany . |
| 3344679 | 1/1987 | Germany . |
| 53-125065 | 11/1978 | Japan . |
| 1156875 | 7/1969 | United Kingdom . |
| 1424875 | 2/1976 | United Kingdom . |
| 2068122 | 8/1981 | United Kingdom . |
| WO90/11610 | 10/1990 | WIPO . |

OTHER PUBLICATIONS

J. T. Klomp, *Bonding of Metals to Ceramics and Glasses* (1972).

*Primary Examiner*—Kenneth J. Ramsey
*Attorney, Agent, or Firm*—Kilpatrick & Cody

[57] ABSTRACT

A method of manufacturing a hermetically sealed conductive feedthrough, particularly for use in ceramic substrates or housing, comprises the steps of inserting an active alloy containing preform into a predetermined insertion hole in a presintered ceramic article and heating the assembly to a temperature to achieve a brazing reaction at the interface of the article and active alloy to produce a hermetically sealed conductive feedthrough. The invention further discloses a non-melting connector pin which may be fixed to the active alloy feedthrough during the above heating step.

17 Claims, 2 Drawing Sheets

SEALED CONDUCTIVE ACTIVE ALLOY FEEDTHROUGHS

FIELD OF THE INVENTION

This invention relates to active alloy feedthroughs. More particularly, the invention relates to sealed conductive active alloy feedthroughs for use in ceramic articles.

BACKGROUND OF THE INVENTION

Metallic feedthroughs (e.g., electrodes) are well known in the industry and are commonly used to provide electrically conductive paths through ceramic articles while excluding the passage of solids, liquids, and gases. One application for such feedthroughs is in a magnetic inductive field flow meter which requires a chemically inert electrode hermetically sealed in the wall of an electrical insulating and chemically resistant ceramic cylinder. Feedthroughs are also used to carry electrical power to/from an active device such as a transistor or diode.

Various commercial methods have been employed to produce metallic feedthroughs. Typically, with alumina ceramics, the feedthroughs (i.e., metallic conductors) are brazed in place using the following multi-step process: As illustrated in FIG. 1, a ceramic article 1 has an ceramic electrode insertion hole 2 which is coated with a moly-manganese or tungsten paint 3 (i.e., ceramic metallization) and sintered at approx. 1,500° C. in wet hydrogen. The inside diameter of the coated insertion hole 2 is then nickel plated 4 and sintered at approx. 950° C. (i.e., metallization plating). The metallic conductor 5 is inserted in the electrode insertion hole 2 with a brazing alloy preform 6 or a paste positioned on the top side to fill voids at the interface of the conductor 5 and the insertion hole 2 upon brazing. The ceramic article 1 and conductor 5 are then simultaneously heated to effectuate brazing of the conductor 5. A major drawback of this method is that, in most instances, the conductor 5 is placed in a vertical position during brazing to avoid migration of the brazing alloy or paste (disposed on the top side of the conductor 5) from regions of the interface under the influence of gravity. This multi-step operation is also very time consuming and expensive.

In U.S. Pat. No. 5,095,759 a method is disclosed wherein a core wire (e.g., platinum) 9, coated with an active alloy paste 7, is inserted into a pre-sintered ceramic insertion hole 8. (See FIG. 2.) The ceramic article 10 and the wire 9 are then simultaneously heated to braze the wire 9 in the hole 8. According to this method, since the paste 7 (i.e., powder) only occupies approx. 50% of the space, an additional alloy, in the form of a brazing filler preform 11 is placed on the top side of the ceramic article 10 to fill the void upon brazing. This method also suffers from similar drawbacks, as noted above.

In U.S. Pat. No. 4,912,838 a method is disclosed wherein an electrode is formed by filling a predetermined hole 12 in a sintered ceramic 13 with a conductive metal paste 14 comprising moly-manganese, tungsten, copper, or similar material and subsequently heating the paste 14 to promote adherence to the ceramic (see FIG. 3). This method often produces conductive feedthroughs that fail during vacuum leak testing.

In Japanese Patent (Laid-open) No. 58-501552 (equivalent to U.S. Pat. No. 4,507,975), another method is disclosed wherein a high melting point but ductile metal pin is inserted into an electrode insertion hole of a cylindrical molded body made of a non-sintered ceramic material (e.g., oxide ceramic). In this state, the molded body is sintered at a predetermined temperature and at the same time the electrode is integrally fixed to the electrode insertion hole by sintering. That is, since a ceramic material contracts (approx. 17 to 20% in the case of $Al_2O_3$) by sintering, the electrode and the molded body are integrally formed, and a liquid-tight seal of the electrode insertion hole is obtained. A noble metal such as platinum or a platinum alloy is used as the electrode material.

According to the noted method, however, in order to reliably seal the electrode insertion hole, the dimensional tolerance between the electrode and the insertion hole, and the mating surface finishes must be strictly controlled. Further, since the non-sintered electrode insertion hole is weak, it is difficult to machine without damage, resulting in a large number of manufacturing steps, and subject to additional damage when the electrode is inserted into the non-sintered electrode insertion hole. Finally, variations in the contraction rate of the ceramic material upon sintering, due to differing lots or manufacturing time, generally result in a defective liquid seal or undesirable residual stresses which could damage the ceramic article upon sintering.

It is therefore an object of the present invention to provide a one step method to produce a sealed conductive feedthrough in a ceramic material.

SUMMARY OF THE INVENTION

The sealed conductive feedthroughs of the present invention substantially reduce or eliminate the disadvantages and shortcomings associated with prior art feedthroughs in an article of ceramic, metal or a combination thereof. A first embodiment of the invention specifically discloses a method for producing hermetically sealed conductive feedthroughs from active alloy wire and comprises the steps of inserting a feedthrough preform into a predetermined insertion hole in a pre-sintered ceramic article and simultaneously heating the ceramic article and feedthrough preform for a predetermined time and at a predetermined temperature to achieve a brazing reaction at the interface of the article and the feedthrough preform to produce a hermetically sealed conductive feedthrough.

The invention further discloses the bonding of a connector pin (i.e., pigtail) to an active alloy containing feedthrough. The feedthrough preforms of this embodiment may comprise an active alloy wire having a sufficiently active element to chemically react with the surface of the ceramic article or a composite wire having a core and an outer layer of an active alloy which would similarly have a sufficiently reactive element to chemically react with both the surface of the ceramic article and the core material. The further discloses a non-melting pigtail (i.e., connector pin) which may be fixed to either feedthrough preform during the above mentioned heating step.

BRIEF DESCRIPTION OF THE DRAWINGS

Further features and advantages will become apparent from the following and more particular description of the preferred embodiment of the invention, as illustrated in the accompanying drawings, in which like referenced characters generally refer to the same parts or elements throughout the views, and in which.

DETAILED DESCRIPTION OF THE INVENTION

Figure 4:
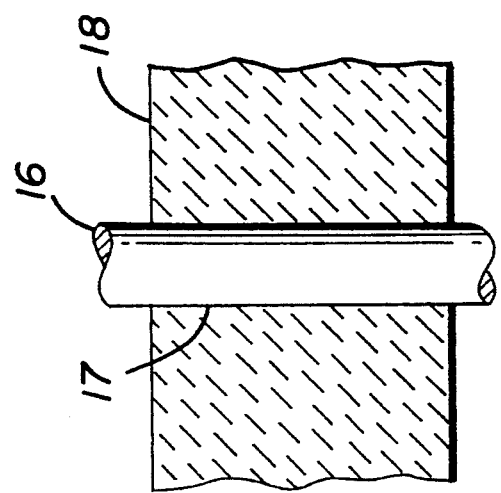
FIG. 4 is a sectional view of a feedthrough according to the invention.

In accordance with the present invention, as illustrated in FIG. 4, the first step in manufacturing a sealed conductive feedthrough is to insert the feedthrough preform 16 into a predetermined insertion hole 17 in a ceramic article 18 whereby the active alloy outer surface of the preform 16 is disposed in contact with the inner surface of the insertion hole 17. The article 18 may also comprise metals and mixtures of metals and ceramics.

According to the invention, the feedthrough preform 16 has an outer surface conforming with the inner surface of the insertion hole 17 and comprises at least in part an active alloy having sufficient active element to chemically react with the inner surface of the insertion hole 17 of the ceramic article 18 and, thereby, enhance the wetting and adherence of the active alloy (i.e., metal) to the ceramic article 18. In the preferred embodiment of the invention, the feedthrough preform 16 comprises an active alloy wire. As will be recognized by one skilled in the art, a key feature of the invention is the use of an active alloy (i.e., active brazing alloy) to achieve a sufficiently bonded and, hence, hermetically sealed conductive feedthrough 16. By the term "hermetically sealed", it is meant to mean an effective gas and, hence, liquid and solid seal exhibiting an acceptable leak rate for the particular application intended. In most instances, this will be preferably less than $10^{-9}$ cc/sec of helium on a conventional helium mass spectrograph.

It is generally recognized that metals will not bond chemically to ceramics because the metallic electronic structure is not compatible with the ionic-covalent electronic structure of ceramic materials. A different phase is thus necessary at the interface as a compatible transition between the metal and the ceramic.

With oxide ceramics, the compatible phase (i.e., chemical bond) is one of the oxides of the metal. The oxide maintains a continuous electronic structure across the interface, and a transition in bond type and bond energies between the metal and the ceramic.

A balance of bond energies and a continuous electronic structure across an interface is generally indicative of a chemical bond, whether the bonding is ionic, covalent, or metallic. These factors do, however, influence the bond microstructure. For example, when the two reacting materials or phases (ceramic/ceramic or metal/metal) have no changes in valence, then the reaction is the formation of a solid solution alloy or compound by interdiffusion. When the two reacting materials (ceramic/metal) have changes in valence, then a reduction-oxidation (redox) reaction occurs.

The driving force for a redox reaction is a favorable negative standard free energy $\Delta G^0_R$. In order to realize a favorable $-\Delta G^0_R$, it is necessary to employ materials (i.e., metals) having sufficiently high oxygen potentials to reduce the cation (i.e., ceramic) with a lower oxidation potential. Such metals are commonly referred to as active elements and include, but are not limited to, titanium, zirconium, chromium and vanadium.

Thus, according to the invention, the feedthrough preform 16 comprises at least in pan an active alloy having sufficient active element to chemically react with the surface of a ceramic article 18. In the preferred embodiment, the feedthrough preform 16 comprises an active alloy wire having a composition substantially comprised of, in weight percent: 0 to 97.5% Au, 0 to 15.5% Ni, 0 to 93.25% Ag, 0 to 35.25% Cu, 0 to 2.25% Ti, 0 to 12.5% In, 0 to 2% Al, 0 to 1% Sn, 0 to 3% Si, 0 to 0.75 % Mo, 0 to 1.75% V, preferably, 58–60% Ag, 26.25–28.25% Cu, 12–13% In, 1–1.5% Ti (Incusil ABA ™). In further embodiments of the invention, the active alloy wire 16 may substantially comprise, in weight percent: 62–64% Ag, 33.25–35.25% Cu, 0.75–1.25% Sn, 1.5–2.0% Ti (Cusin-1 ABA ™); 62–64% Ag, 34.25–36.25% Cu, 1.5–2.0% Ti (Cusil ABA ™); 92.25–93.25% Ag, 4.5–5.5% Cu, 0.75–1.25% Al, 1–1.5% Ti (Silver ABA ™); 92.25–93.25% Cu, 1.75–2.25% Al, 2.75–3.25% Si, 2–2.5% Ti (Copper ABA ™); 95.9–96.9% Au, 2.5–3.5% Ni, 0.5–0.7% Ti (Gold ABA ™); and 81–83% Au, 14.5–16.5% Ni, 0.5–1.0% Mo, 1.5–2.0% V (Nioro ABA ™). These active alloys are commercially available under the aforementioned trademarks from Wesgo, Inc., a division of The Morgan Crucible Company, plc.

According to the method of the invention, the second step comprises simultaneously heating the article 18 and feedthrough preform 16 for a predetermined time and at a predetermined temperature to achieve a brazing reaction at the interface between the inner surface of the insertion hole 17 of the article 18 and the outer surface of the feedthrough 16 to produce a hermetically sealed feedthrough 16. Preferably, the heating time and temperature is sufficient to achieve the brazing reaction while avoiding substantial migration of the active alloy from regions of the interface under the influence of gravity.

By the term "brazing reaction", it is meant to mean the occurrence of the requisite reduction-oxidation (redox) reaction at the interface of the active alloy and the ceramic article whereby a chemical bond is achieved at the interface. As will be recognized by one skilled in the art, the brazing temperature will, in most instances, be at or near the liquidus temperature for the active alloy.

It has been found that by maintaining the brazing reaction temperature for a predetermined time, in addition to achieving the requisite redox reaction at the interface of the feedthrough preform 16 and the article 18, the active alloy will wet to and generally flow into the capillary gaps in the ceramic article 18, notwithstanding the orientation (i.e., vertical, horizontal, etc.) of the feedthrough preform 16. In addition, when the feedthrough preform (i.e., active alloy wire) 16 is melted in the insertion hole 17, the feedthrough 16 will generally fill any imperfections in the hole 17. These factors significantly enhance the hermetic sealing of the feedthrough 16 in the insertion hole 17.

Thus, as will be recognized by one skilled in the art, various compatible ceramic/active alloy systems within the scope of this invention may be employed to meet the requirements of a particular application. The general requirement of a compatible system is, of course, that the active alloy have a melting point less than the ceramic host.

Figure 5:
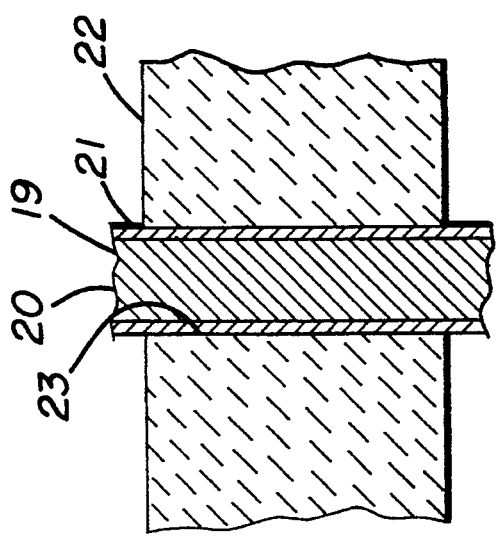
FIG. 5 is a sectional view of another embodiment of the feedthrough according to the invention.

In a further embodiment of the invention, a pigtail, 25, is combined with an active alloy containing feedthrough. The active alloy containing feedthrough preform herein may be a clad preform. As illustrated in FIG. 5, the feedthrough preform 19 comprises a composite wire having a core 20 and at least an outer layer 21 of an active alloy having sufficient active element to chemically react with the surface of a ceramic article 22. The core 20 generally comprises an electrically conductive material which has a higher melting point than the active alloy outer layer 21. Preferably, the core 20 comprises a material selected from the group consisting of Kovar TM, gold, copper, nickel, platinum, silver, palladium, molybdenum, niobium, titanium, zirconium, iron and alloys thereof.

The active alloy outer layer 21 of the composite wire preform 19 would have a composition substantially comprised of, in weight percent: 0 to 98% Au, 0 to 20% Ni, 0 to 93.25% Ag, 0 to 35.25% Cu, 0 to 2.25% Ti, 0 to 12.5% In, 0 to 2% Al, 0 to 1% Sn, 0 to 3% Silicon, 0 to 4% Mo, 0 to 6% V, preferably 58–60% Ag, 26.25–28.25% Cu, 12–13% In, 1–1.5% Ti (Incusil ABA TM). In further embodiments of the invention, the active alloy outer layer 21 may substantially comprise, in weight percent: 62–64% Ag, 33.25–35.25% Cu, 0.75–1.25% Sn, 1.5–2.0% Ti (Cusin-1 ABA TM); 62–64% Ag, 34.25–36.25% Cu, 1.5–2.0% Ti (Cusil ABA TM); 92.25–93.25% Ag, 4.5–5.5% Cu, 0.75–1.25% Al, 1–1.5% Ti (Silver ABA TM); 92.25–93.25% Cu, 1.75–2.25% Al, 2.75–3.25% Si, 2–2.5% Ti (Copper ABA TM); 95.9–96.9% Au, 2.5–3.5% Ni, 0.5–0.7% Ti (Gold ABA TM); 81–83% Au, 14.5–16.5% Ni, 0.5–1% Mo, 1.50–2% V (Nioro ABA TM); 5–25% Pd, 5–25% Cu, 20–85% Ag, and from about 0.25–4% of a metal selected from the group consisting of Ti, V and Zr (Palcusil 10 ABA TM); 75–98% Au, 0.5–20% Ni, 0.5–6% V; 75–98% Au, 0.5–20% Ni, 0.5–6% V, 0.25–4% Mo; 75–98% Au, 0.5–20% Ni, 0.5–6% V, 0.3–5% Cr; and 75–98% Au, 0.5–20% Ni, 0.5–6% V, 0.3–5% Cr, 0.25–4% Mo.

As will be recognized by one skilled in the art, various compatible materials within the scope of this invention may be employed to produce the composite wire feedthrough preform 19. It has, however, been found that certain requirements of compatibility should be adhered to realize the full benefits of the invention. First, the core material must not readily alloy with the active alloy outer layer. For example, a silver ABA outer layer with a copper core could form an undesirable lower melting point silver-copper eutective alloy. Second, the annealing temperature range for both the core and active alloy outer layer should be similar.

It has also been found that the thickness of the active alloy outer layer 21 should be maintained in the range of approximately 0.001 to 0.010 in. to realize optimum wetting and adherence of the composite wire feedthrough 19 to the ceramic article 22 (or host).

In the preferred embodiment, the active alloy outer layer 21 would comprise a cladding disposed immediately adjacent to, and completely surrounding, the core 20. The cladding is generally of solid form such as an ABA sleeve.

The active alloy clad wire 19 may also be mechanically reduced to a predetermined size and shape. For example, the clad wire 19 may be drawn to achieve the desired cladding thickness or upset (i.e., flattened) on one end to form a flat tab for electrical attachment or to form a flat (i.e., nail head) bonding face. The flattened end or tab may also be employed as a mechanical stop to position and anchor the wire 19 in place during the heating step, thus eliminating the need for gaging or pastes. The clad wire 19 may also be upset at mid-length with electrical leads disposed on each end.

Figure 1:
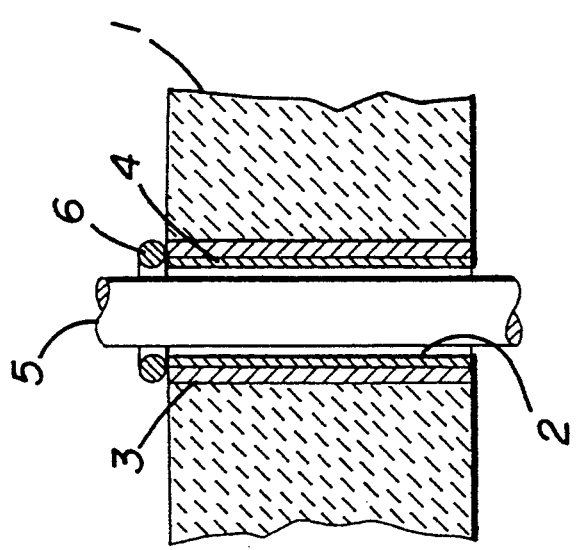
FIGS. 1-3 are sectional views of prior art feedthroughs (i.e. metallic conductors)
Figure 2:
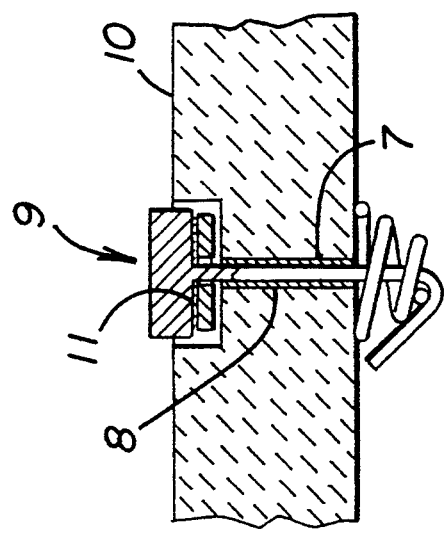
Figure 3:
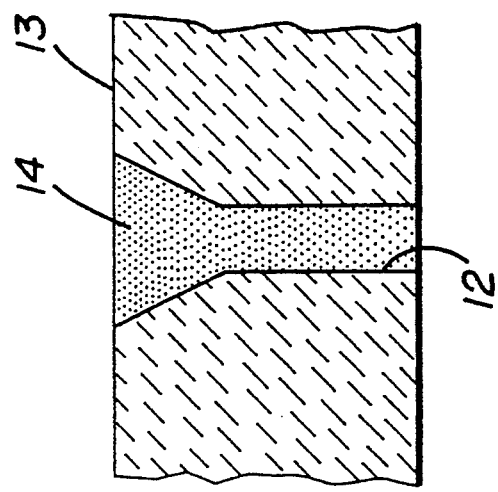

A further advantage of the composite wire feedthrough 19 is that the extra active alloy cladding 21, which is available from the wire being slightly extended from the insertion hole 23, will be drawn toward the ceramic surface and generally fill any voids in the hole 23. Thus, active alloy pastes or preforms 11, as illustrated in FIG. 2, are not required.

As will be recognized by one skilled in the art, an additional advantage of the composite wire feedthrough 19 is that the feedthrough may be employed for use in relatively large (i.e., >0.020" dia.) insertion holes 23. The maximum diameter of the active alloy wire feedthrough would be dictated by several variables including the surface tension at the interface, brazing temperature, alloy composition, etc.

Figure 6:
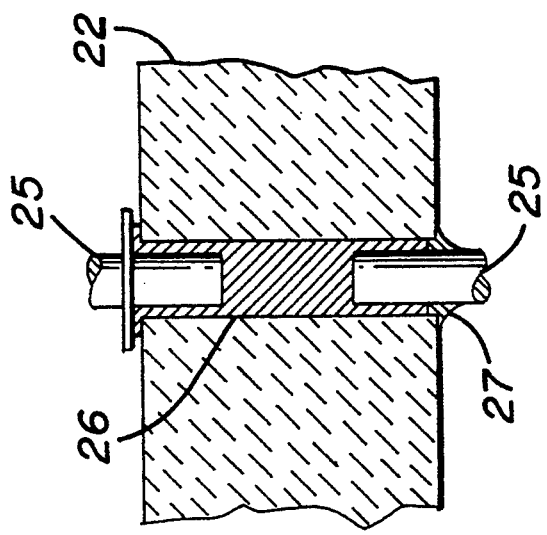
FIG. 6 is a sectional view of yet another embodiment of the feedthrough according to the invention.

According to the method of the invention, a further step may be employed whereby a pigtail 25 is placed on at least one end of the feedthrough 26 during the heating and melting of the active alloy (i.e., wire or outer layer), whereby the pigtail 25 is effectively fixed to the feedthrough 26 upon cooling (see FIG. 6). By the term "pigtail", it is meant to mean a connecter pin or conductive end piece used to facilitate electrical connection and, hence, transfer of electrical energy and/or signals to and from a body. In this instance, the pigtail 25 may be employed to transfer signals to/from the feedthrough 26 or as an electrode surface (i.e., contact point).

Various conventional fixturing methods may be employed to position and anchor the pigtail(s) 25 in place during the melting of the active alloy 26. For example, the pigtail(s) 25 may be self-centering or self-fixturing, i.e., designed to be positioned by the insertion hole itself and anchored therein by the frictional forces between the pigtail 25 and the insertion hole (e.g., slight press fit) or designed and configured to engage the outside diameter or configuration of the ceramic body 22 proximate the insertion hole (e.g., ribbon clip) (see FIG. 6). Various alloy pastes may also be employed to position and anchor the pigtail(s) 25 in place during melting of the active alloy 26.

In the preferred embodiment of the invention, the pigtail 25 would comprise a conductive material. Preferably, the pigtail 25 would comprise a material selected from the group consisting of Kovar TM copper, platinum, nickel, gold, silver, molybdenum, niobium, zirconium, titanium, palladium, iron and alloys thereof.

As will be recognized by those skilled in the art, the pigtail 25 may have a wide variety of shape characteristics including variable cross-sectional dimensions (i.e. round or flat ribbon, or one transitioning to another). The pigtail 25 can also be tailored to the particular application on either side of the feedthrough 26 as may be required. For example, two pigtails may be employed with different cross-sections and/or different compositions (i.e., copper on one side and platinum on the other side).

To enhance the sealing of the feedthrough 26 and the mechanical bond of the pigtail 25 to the feedthrough 26, an active brazing alloy paste 27 may be placed around the pigtail 25 prior to heating of the feedthrough 26 and, hence, melting of the active alloy. According to the invention, the active brazing alloy paste 27 could have a composition substantially comprised of, in weight percent: 0–92.75% Ag, 0–35.25% Cu, 0–12.5% In, 0–1.0% Sn, 0–1.0% Al, 0–1.75% Ti, preferably, 59.0% Ag, 27.25% Cu, 12.5% In, 1.25% Ti. In further embodiments of the invention, the active alloy paste 27 may have a composition substantially comprised of, in weight percent: 63.0% Ag, 34.25% Cu, 1.0% Sn, 1.75% Ti; 63.0% Ag, 35.25% Cu, 1.75% Ti; and 92.75% Ag, 5.0% Cu, 1.0% Al, 1.75% Ti.

The control and examples which follow illustrate the methods of manufacturing the conductive feedthroughs of the present invention. The examples are for illustrative purposes only and are not meant to limit the scope of the claims in any way.

EXAMPLE 1

A 0.011" diameter Cusin-1 ABA ™ (63.0% Ag, 34.25% Cu, 1.0% Sn, 1.75% Ti) active braze alloy wire was inserted into a 0.012" diameter hole in an alumina ceramic body (0.064" wall thickness). The wire preform was cut to leave zero to ⅛" overhang on each end of the hole. The assembly was placed in a vacuum furnace and heated to 825° C. under $10^{-5}$ torr vacuum. The active alloy feedthrough was then tested with a helium mass spectrograph. The feedthrough was found to be hermetically sealed having a leak rate of less than $10^{-9}$ cc/second.

EXAMPLE 2

An active alloy covered composite alloy wire was produced by inserting a 0.588 O. D. Kovar ™ rod into a 0.592" I. D. X. 0.750" O. D. (tubing) alloy with a composition of 63% Ag, 34.25% Cu, 1% Sn, 1.75Ti. The assembly was reduced to a wire 0.0185" diameter by conventional wire drawing.

Approximately 0.25" length of one end of the wire was flattened and cut to a length of 0.550". The 0.0185" diameter wire was inserted into a sintered alumina 0.050" thick with a 0.020" hole, leaving 0.25" protruding at each end. The assembly was placed in a vacuum furnace and heated to 830° C. under $10^{-5}$ torr vacuum. The brazed assembly, after cooling, demonstrated that the brazing alloy from each protruding end flowed toward the alumina to fill the hole and leave a fillet at each face of the alumina feedthrough. The brazed seal was tested with a helium mass spectrograph and exhibited an acceptable leak rate of less than $10^{-9}$ cc/second.

EXAMPLE 3

An active alloy coated wire as described in Example 2 was mechanically upset to form a nail head. The wire end was cut to 0.30" long and inserted into an alumina ceramic 0.050" thick with a hole 0.020" in diameter. The assembly was brazed in a vertical position with the nail head on top using similar brazing schedule as in example 2. The brazed assembly had provided a hermetic feedthrough with a slight fillet at each end. The brazed assembly had an acceptable leak rate of less than $10^{-9}$ cc/sec.

EXAMPLE 4

Seventeen alumina ceramic tubes, having a wall thickness of 0.105", were produced with four radial through wall holes of 0.012" dia. each. Bands of internal metallization were applied adjacent to some of the holes. Cusin ABA ™ active braze alloy wire (0.011" dia.) was inserted into each of the holes with an overhang of 1/16" on each end. Cusin ABA ™ paste was applied to the outermost end of the active alloy wire to promote formation of an external bead of alloy after melting. Under high vacuum at 825° C. the active braze alloy constituents were melted forming vacuum tight seals and through wall electrical contacts between the outside of the assembly and the inside metallized layers.

EXAMPLE 5

An additional fifteen alumina ceramic tubes were produced as described in Example 4, with the following exceptions. The active alloy wire was cut to terminate 0.025" inside the ceramic hole on the outside. Inserted into the hole was a 0.010" thick×0.060" wide nickel ribbon with a stamped end to allow insertion into the hole at least 0.025". Active braze alloy paste was applied to the nickel ribbon-ceramic interface to promote mechanical adherence. After heating to 825° C. in vacuum, all assemblies were vacuum tight and electrically conductive. The nickel ribbon on the outside allowed easy electrical connection to the interior metallized circuitry.

EXAMPLE 6

In this example, both an external nickel ribbon pigtail and an internal tungsten alloy wire were connected with the melted ABA via under similar conditions as described in Examples 4 and 5. Electrically conductive and vacuum tight joints were produced in both cases.

Without departing from the spirit and scope of this invention, one or ordinary skill can make various changes and modifications to the invention to adapt it to various usages and conditions. As such, these changes and modifications are properly, equitably, and intended to be, within the full range of equivalents of the following claims.

What is claimed is:

1. A method of manufacturing a hermetically sealed conductive feedthrough in an article comprising the steps of:
   inserting an active alloy wire into a predetermined insertion hole in an article comprising a material selected from the group consisting of ceramics, metals and mixtures thereof, said wire conforming with the inner surface of said insertion hole and having sufficient active element to chemically react with the inner surface of the insertion hole of said article, said wire being disposed in said insertion hole whereby said wire is disposed in contact with said inner surface of said insertion hole; and
   simultaneously heating said article and said wire for a predetermined time and at a predetermined temperature to achieve a brazing reaction at the interface between said inner surface of said insertion hole of said article and said wire to produce a hermetically sealed feedthrough,
   said heating time and said heating temperature being sufficient to achieve said brazing reaction while avoiding substantial migration of the active alloy of said wire from regions of said interface under the influence of gravity.

2. The method of claim 1 wherein said active alloy wire has a composition substantially comprised of, in weight percent: 0–97.5% Au, 0–15.5% Ni, 0–93.25% Ag, 0–35.25% Cu, 0–2.25% Ti, 0–12.5% In, 0–2% Al, 0–1% Sn, 0–3% Si, 0–0.75% Mo, 0–1.75% V.

3. The method of claim 2 wherein said active alloy wire has a composition substantially comprised of, in weight percent: 58–60% Ag, 26.25–28.25% Cu, 12–13% In, 1–1.5% Ti.

4. The method of claim 2 wherein said active alloy wire has a composition substantially comprised of, in weight percent: 62–64% Ag, 33.25–35.25% Cu, 0.75–1.25% Sn, 1.5–2.0% Ti.

5. The method of claim 2 wherein said active alloy wire has a composition substantially comprised of, in weight percent: 62–64% Ag, 34.25–36.25% Cu, 1.5–2.0% Ti.

6. The method of claim 2 wherein said active alloy wire has a composition substantially comprised of, in weight percent: 92.25–93.25% Ag, 4.5–5.5% Cu, 0.75–1.25% Al, 1–1.5% Ti.

7. The method of claim 2 wherein said active alloy wire has a composition substantially comprised of, in weight percent: 92.25–93.25% Cu, 1.75–2.25% Al, 2.75–3.25% Si, 2–2.5% Ti.

8. The method of claim 2 wherein said active alloy wire has a composition substantially comprised of, in weight percent: 95.9–96.9% Au, 2.5–3.5% Ni, 0.5–0.7% Ti.

9. The method of claim 2 wherein said active alloy has a composition substantially comprised of, in weight percent: 75–98% Au, 0.5–20% Ni, 0.25–4% Mo, 0.5–6% V.

10. A method of manufacturing a hermetically sealed conductive feedthrough in an article comprising the steps of:
inserting an active alloy wire preform into a predetermined insertion hole in an article comprising a material selected from the group consisting of ceramics, metals and mixtures thereof, said wire preform having an outer surface conforming with the inner surface of said insertion hole and having sufficient active element to chemically react with the inner surface of the insertion hole of said article, said wire preform being disposed in said insertion hole whereby said active alloy wire outer surface is disposed in contact with said inner surface of said insertion hole;
placing an electrically conductive pigtail on at least one end of said wire preform;
simultaneously heating said article, said wire preform and said pigtail for a predetermined time and at a predetermined temperature to achieve a brazing reaction at the interface between said inner surface of said insertion hole of said article and said outer surface of said wire preform to produce a hermetically sealed feedthrough,
said heating time and said heating temperature being sufficient to achieve said brazing reaction while avoiding substantial migration of the active alloy of said wire preform from regions of said interface under the influence of gravity,
whereby said pigtail is effectively fixed to said wire preform upon cooling.

11. The method of claim 10 wherein said electrically conductive pigtail comprises a metal selected from the group consisting of Kovar TM, copper, platinum, nickel, gold, silver, palladium, molybdenum, niobium, titanium, zirconium, iron and alloys thereof.

12. The method of claim 11 wherein an active brazing alloy paste is placed around said pigtail prior to heating and melting of said wire preform to enhance the sealing of said wire preform and the mechanical bond of said pigtail to said wire preform.

13. The method of claim 12 wherein said active brazing alloy paste has a composition substantially comprised of, in weight percent: 0–92.75% Ag, 0–35.25% Cu, 0–12.5% In, 0–1% Sn, 0–1% Al, 0–1.75% Ti.

14. The method of claim 13 wherein said active alloy paste has a composition substantially comprised of, in weight percent: 59.0% Ag, 27.25% Cu, 12.5% In, 1.25% Ti.

15. The method of claim 13 wherein said active alloy paste has a composition substantially comprised of, in weight percent: 63.0% Ag, 34.25% Cu, 1.0% Sn, 1.75% Ti.

16. The method of claim 13 wherein said active alloy paste has a composition substantially comprised of, in weight percent: 63% Ag, 35.25% Cu, 1.75% Ti.

17. The method of claim 13 wherein said active alloy paste has a composition substantially comprised of, in weight percent: 92.75% Ag, 5.0% Cu, 1.0% Al, 1.25% Ti.

* * * * *